United States Patent
Lu et al.

(10) Patent No.: US 10,903,547 B2
(45) Date of Patent: Jan. 26, 2021

(54) ELECTRONIC PACKAGE

(71) Applicant: Siliconware Precision Industries Co., Ltd., Taichung (TW)

(72) Inventors: Ying-Wei Lu, Taichung (TW); Bo-Siang Fang, Taichung (TW); Kuan-Ta Chen, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 71 days.

(21) Appl. No.: 16/192,262

(22) Filed: Nov. 15, 2018

(65) Prior Publication Data
US 2019/0363423 A1 Nov. 28, 2019

(30) Foreign Application Priority Data
May 23, 2018 (TW) .............. 107117524 A

(51) Int. Cl.
*H01Q 1/22* (2006.01)
*H01Q 9/04* (2006.01)
*H01Q 1/38* (2006.01)
*H01L 23/66* (2006.01)

(52) U.S. Cl.
CPC .......... *H01Q 1/2283* (2013.01); *H01L 23/66* (2013.01); *H01Q 1/38* (2013.01); *H01Q 9/0407* (2013.01)

(58) Field of Classification Search
CPC ...... H01Q 1/2283; H01Q 9/0407; H01Q 1/38; H01Q 9/0457; H01L 23/66; H01L 2924/30111; H01L 2924/37001; H01L 2224/131; H01L 2223/6677; H01L 2224/48227; H01L 2224/16227
See application file for complete search history.

(56) References Cited

U.S. PATENT DOCUMENTS

2011/0291233 A1* 12/2011 Gaynor .............. H01L 21/565
                                                                257/531
2019/0326674 A1* 10/2019 Kang ................. H01Q 9/0457

* cited by examiner

*Primary Examiner* — Dameon E Levi
*Assistant Examiner* — David E Lotter
(74) *Attorney, Agent, or Firm* — Mintz Levin Cohn Ferris Glovsky and Popeo, P.C.; Peter F. Corless; Steven M. Jensen

(57) ABSTRACT

An electronic package includes an antenna structure and an adjustment structure arranged on a carrier structure. The antenna structure includes an antenna body and a feed line that are disposed on different layers and a conductive pillar that interconnects the layers to electrically connect the antenna body and the feed line. The adjustment structure extends from the feed line to improve the bandwidth of the antenna body.

11 Claims, 3 Drawing Sheets

ELECTRONIC PACKAGE

CROSS-REFERENCE TO RELATED APPLICATION

This Application claims under 35 U.S.C. § 119(a) the benefit of Taiwanese Patent Application No. 107117524 filed on May 23, 2018. The entire contents of these applications are incorporated herein by reference in their entirety.

BACKGROUND

1. Technical Field

The present disclosure relates to electronic packages, and, more particularly, to an electronic package with an antenna structure.

2. Description of Related Art

With the rapid development in electronic industry, electronic products are trending towards multiple functions and high performance. Current wireless communication technology has been widely used in a myriad of consumer electronic products to enable the reception and/or transmission of various kinds of wireless signals. In order to satisfy the design requirements for consumer electronic products, manufacturing of wireless communication modules are done with compactness and lightweight in mind. Among which, patch antennae are often used in the wireless communication modules of electronic products (e.g., cell phones) owing to their small sizes, light weight and ease of manufacturing.

FIG. 1A is a cross-sectional view of a traditional wireless communication module 1. The wireless communication module 1 includes a substrate 10, a chip (not shown) provided on the substrate 10, an antenna structure 12, and a grounding structure 15. The substrate 10 is a rectangular circuit board with a plurality of insulating layers 13a, 13b and 13c. The chip is arranged on the substrate 10 and electrically connected with the substrate 10. The antenna structure 12 includes an antenna body 120 disposed on the upper insulating layer 13a, a feed line 121 disposed at the lower insulating layer 13c, and a conductive pillar 122 penetrating the insulating layers 13a, 13b and 13c for electrically connecting the antenna body 120 and the feed line 121. Also, as shown in FIG. 1B, the feed line 121 has one end that is a port 121a, and the other end that is connected to the conductive pillar 122. The grounding structure 15 includes two grounding layers 15a and 15b disposed on the insulating layers 13b and 13c, respectively, and a plurality of conductive blind vias 150 for connecting the grounding layers 15a and 15b.

In the traditional wireless communication module 1, the antenna body 120 is, for example, a patch antenna. The antenna body 120, though being structurally simple and easy to design, faces limitation in terms of its applications due to its narrow bandwidth.

As a result, a dielectric layer 140 and a parasitic patch 141 have been added on top of the antenna body 120 as an adjustment structure 14, such that the parasitic patch 141 creates an additional resonant frequency band that increases the bandwidth, thereby alleviating the bandwidth limitation of the traditional antenna body 120 (i.e., patch antenna).

In the traditional wireless communication module 1, the adjustment structure 14 is laminated on the antenna body 120 as a build-up layer. As the numbers of dielectric layers 140 and the parasitic patches 141 increase, the number of manufacturing steps, the cost, and the overall structure thickness increase accordingly. The yields are also likely to be lowered. Therefore, there is a need for a solution that addresses the aforementioned issues in the prior art.

SUMMARY

In view of the aforementioned shortcomings of the prior art, the present disclosure provides an electronic package, which may comprise: a carrier structure; an antenna structure bonded to the carrier structure and including an antenna body, a feed line, and a conductive pillar electrically connecting the antenna body with the feed line; and an adjustment structure bonded to the carrier structure and extending from the feed line for adjusting a bandwidth of the antenna body.

In an embodiment, the feed line has a first end as a port and a second end connected with the conductive pillar and the adjustment structure.

In an embodiment, the adjustment structure and the feed line are formed on a same plane.

In an embodiment, the adjustment structure and the feed line are formed integrally. In an embodiment, the adjustment structure and the feed line are composed of a same metal layer.

In an embodiment, the adjustment structure includes a conductive wire connected with the feed line and a functional portion connected with the conductive wire. In another embodiment, one end of the conductive wire forks into the functional portion and an extension portion.

In an embodiment, the electronic package further includes a grounding structure bonded to the carrier structure. In another embodiment, the grounding structure includes a plurality of grounding layers and conductive blind vias connected with the grounding layers. In yet another embodiment, the adjustment structure may be electrically connected with the grounding structure.

As can be seen from the above, the electronic package according to the present disclosure improves the bandwidth of the antenna body and its practicality by providing the adjustment structure that extends from the feed line.

Moreover, the adjustment structure extending from the feed line is configured such that the adjustment structure and the feed line are formed on the same insulating layer, and that the adjustment structure and the feed line can be formed simultaneously and integrally. Therefore, compared to the traditional design that the adjustment structure is provided on the top of the antenna body, the electronic package according to the present disclosure is capable of manufacturing the adjustment structure without any additional manufacturing steps, thereby improving yield, and reducing cost and thickness of the overall structure of the electronic package.

BRIEF DESCRIPTION OF THE DRAWINGS

FIG. 2C' is another embodiment of FIG. 2C.

DETAILED DESCRIPTION OF THE EMBODIMENTS

Figure 1A:
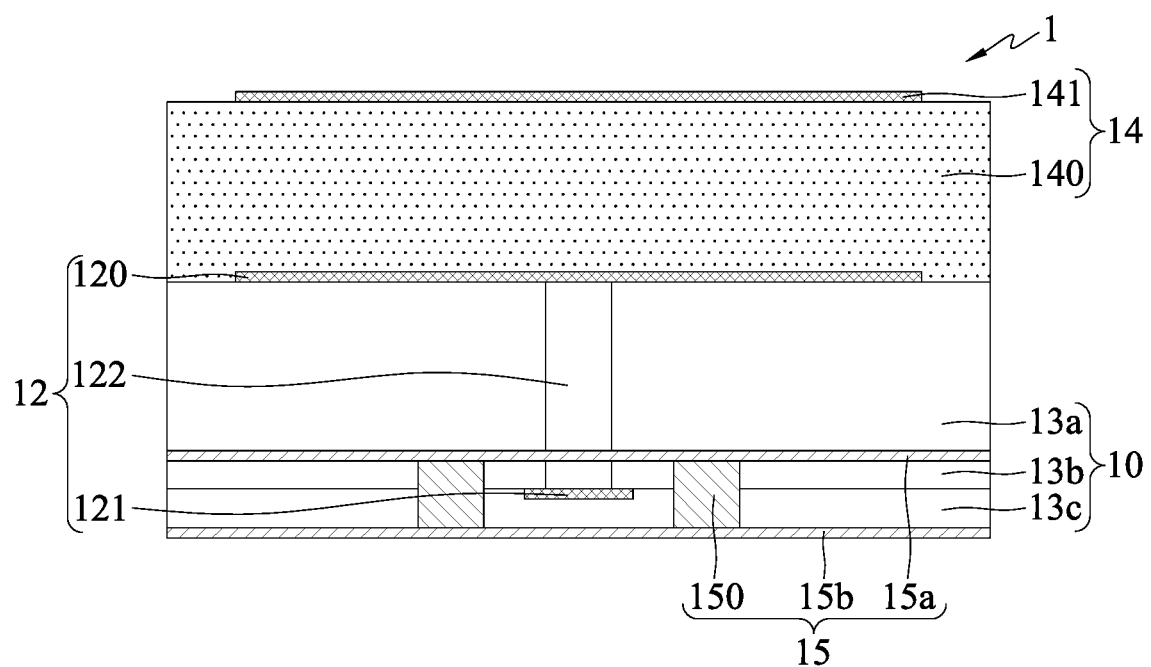
FIG. 1A is a cross-sectional schematic view of a traditional wireless communication module.
Figure 1B:
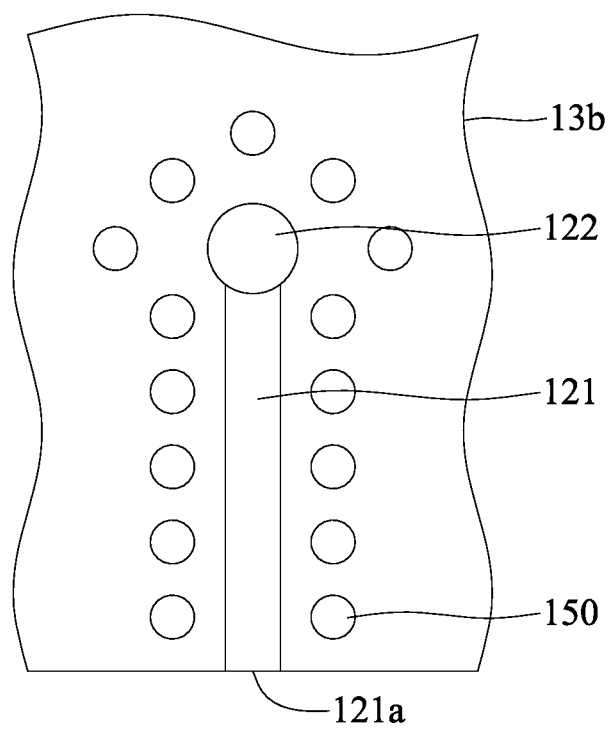
FIG. 1B is a partial top view of a traditional wireless communication module.

The technical content of present disclosure is described using the following specific embodiments. One of ordinary skill in the art can readily appreciate the advantages and technical effects of the present disclosure upon reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any way, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
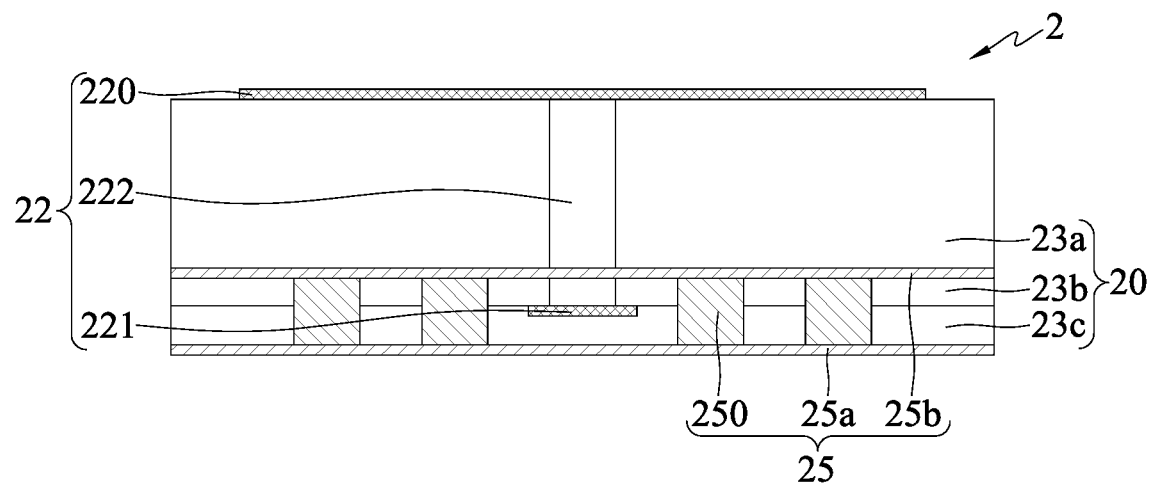
FIG. 2A is a cross-sectional schematic view of an electronic package in accordance with the present disclosure.
Figure 2B:
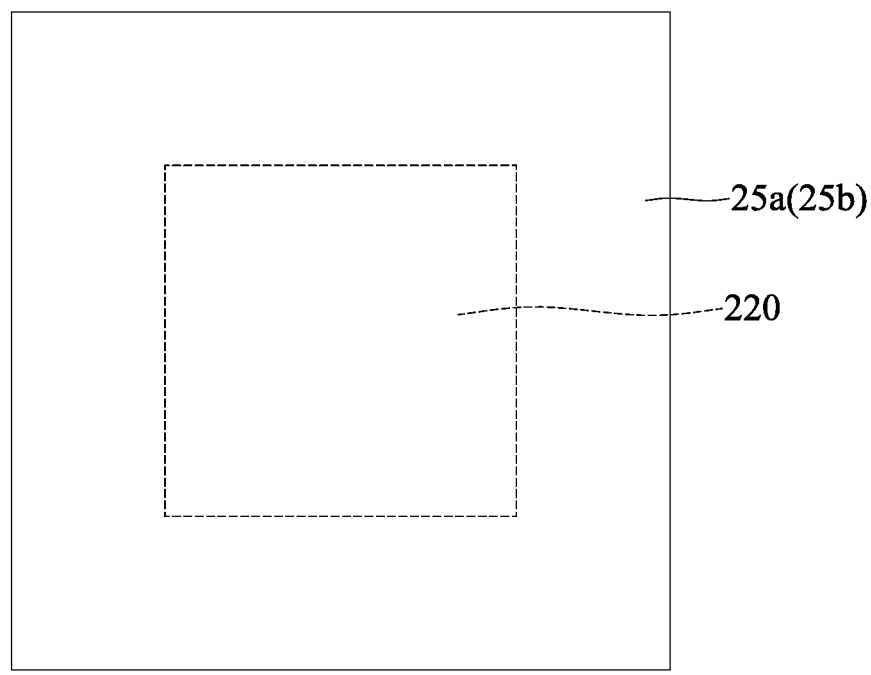
FIG. 2B is a bottom schematic plane view of FIG. 2A.
Figure 2C:
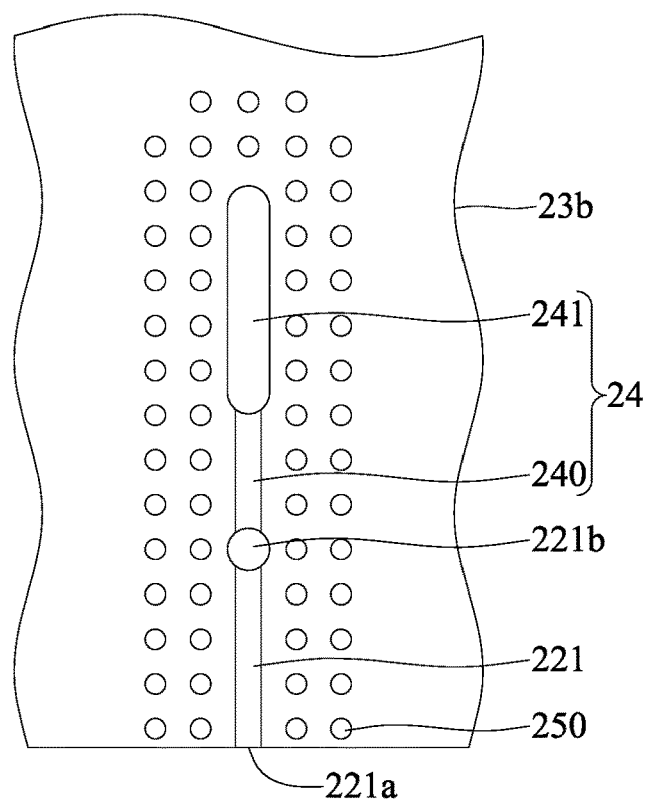
FIG. 2C is a partial schematic plane view of an interlayer of FIG. 2A.
Figure 2C:
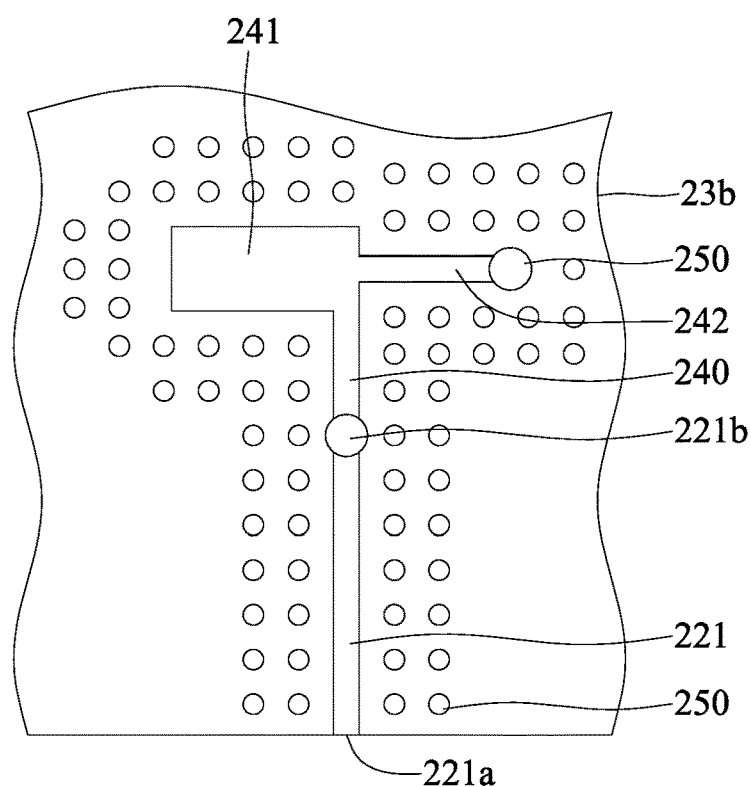

FIGS. 2A to 2C are schematic diagrams depicting an electronic package 2 in accordance with the present disclosure. In an embodiment, the electronic package 2 is, for example, a System-in-Package (SiP) wireless communication module.

The electronic package 2 includes: a carrier structure 20, an electronic component (not shown) disposed on the carrier structure 20, an antenna structure 22, an adjustment structure 24, and a grounding structure 25.

As shown in FIG. 2A, the carrier structure 20 may be rectangular. In an embodiment, the carrier structure 20 can be, for example, a package substrate with a core layer and circuit structures or a coreless circuit structure. The carrier structure 20 includes a plurality of insulating layers 23a, 23b and 23c and a plurality of circuit layers formed on the insulating layers 23a, 23b and 23c, such as fan-out redistribution layers (RDLs).

In an embodiment, the insulating layers 23a, 23b and 23c can be made of dielectric materials, polyimide (PI), dry films, epoxy or molding compounds, etc., but the present disclosure is not limited to these.

The electronic component may be an active element, a passive element, or a combination of both. The active element can be, for example, a semiconductor chip, and the passive element can be, for example, a resistor, a capacitor or an inductor. In an embodiment, the electronic component is electrically connected with the circuit layers via a plurality of wires by wire bonding. In an embodiment, the electronic component can be disposed on the circuit layers via a plurality of conductive bumps made of solder materials in a flip-chip manner. In another embodiment, the electronic component can be in direct contact with the circuit layers. It can be appreciated that there are numerous ways of electrically connecting the electronic component with the carrier structure 20, and the present disclosure is not limited to those described above.

The antenna structure 22 is bonded to the carrier structure 20 and electrically connected with the circuit layers of the carrier structure 20. The antenna structure 22 includes an antenna body 220 disposed at the upper insulating layer 23a, a feed line 221 disposed at the lower insulating layer 23c, and a conductive pillar 222 penetrating the insulating layers 23a, 23b, and 23c for electrically connecting the antenna body 220 with the feed line 221.

In an embodiment, the antenna structure 22 can be formed by coating of a metal layer (e.g., copper material), for example, through sputtering, vaporing, electroplating or electroless plating (chemical plating). Alternatively, the antenna structure 22 can be formed by lamination or foiling.

As shown in FIG. 2C, one end of the feed line 221 is a port 221a for electrically connected with the circuit layers of the carrier structure 20, while the other end of the feed line 221 is a pad section 221b for connecting with the conductive pillar 222 and the adjustment structure 24. In an embodiment, the conductive pillar 222 extends from the pad section 221b in a longitudinal direction (perpendicular to the plane of the pad section 221b).

The adjustment structure 24 extends from the feed line 221 to be used as a stepped impedance resonator (SIR) for matching and adjustment.

In an embodiment, the adjustment structure 24 and the feed line 221 are on the same insulating layer 23b. In another embodiment, the adjustment structure 24 and the feed line 221 can be simultaneously formed as the same metal layer through a patterning process (e.g., electroplating of metal or etching of metal), or even simultaneously formed with the circuit layers of the carrier structure 20, such as a RDL process.

Furthermore, the adjustment structure 24 includes a conductive wire 240 connected with the pad section 221b and a functional portion 241 connected with the conductive wire 240. As shown in FIG. 2C, the conductive wire 240 of the adjustment structure 24 extends along the same plane as the pad section 221b, such that the other end of the conductive wire 240 forms the functional portion 241.

The grounding structure 25 is bonded to the carrier structure 20 and includes two grounding layers 25a and 25b disposed on the carrier structure 20 and a plurality of conductive blind vias 250 connected with the grounding layers 25a and 25b and arranged around the feed line 221 and the adjustment structure 24.

In an embodiment, the grounding layers 25a and 25b are isolated from each other, and arranged on two opposite sides of the insulating layers, such as on the insulating layers 23b and 23c, respectively. In another embodiment, the grounding structure 25 can be formed by coating of a metal layer (e.g., a copper material), for example, by sputtering, vaporing, electroplating or electroless plating. In yet another embodiment, these grounding layers 25a and 25b can be formed by lamination or foiling.

In an embodiment, these grounding layers 25a and 25b can selectively cover the vertical projected range of the surface region of the carrier structure 20 as needed, such as the entire surface shown in FIG. 2B, so that the its vertical projected range is larger than the vertical projected range of the antenna body 220.

As shown in FIG. 2C', the adjustment structure 24 may include an extension portion 242 connected with the conductive wire 240 in order to connect to one of the conductive blind vias 250. In an embodiment, one end of the conductive wire 240 is forked into two paths, one of which is used as the functional portion 241 or called a short end stub, and the other of which is the extension portion 242 or called an open end stub. In theory, a stepped impedance resonator with a shorted end can be seen as an equivalent structure of a capacitor and an inductor at a resonant frequency, such that the functional portion 241 and the extension portion 242 can also be seen as an equivalent structure of a capacitor and an inductor that achieves the same effect as an SIR after appropriate design adjustments.

In summary, the electronic package 2 according to the present disclosure improves the bandwidth of the antenna body 220 and its practicality by providing the adjustment structure 24 that extends from the feed line 221.

In an embodiment, the adjustment structure 24 extending from the feed line 221 is configured such that the adjustment structure 24 and the feed line 221 are formed on the same insulating layer 23*b*, and that the adjustment structure 24 and the feed line 221 can be formed simultaneously and integrally. Therefore, compared to the traditional design where the adjustment structure is provided on top of the antenna body, the electronic package according to the present disclosure is capable of manufacturing the adjustment structure 24 without any additional manufacturing steps, thereby improving yield, reducing cost and thickness of the overall structure of the electronic package 2.

The above embodiments are only set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. An electronic package, comprising:
    a carrier structure;
    an antenna structure bonded to the carrier structure and including an antenna body, a feed line having one end, and a conductive pillar in direct contact with the antenna body and the feed line to electrically connect the antenna body with the feed line; and
    an adjustment structure bonded to the carrier structure and extending from the end of the feed line for adjusting a bandwidth of the antenna body,
    wherein the adjustment structure and the feed line are formed by a same metal layer.

2. The electronic package of claim 1, wherein the feed line has a first end as a port.

3. The electronic package of claim 2, wherein the feed line has a second end connected with the conductive pillar and the adjustment structure.

4. The electronic package of claim 1, wherein the adjustment structure and the feed line are formed on a same plane.

5. The electronic package of claim 1, wherein the adjustment structure and the feed line are formed integrally.

6. The electronic package of claim 1, wherein the adjustment structure includes a conductive wire connected with the feed line and a functional portion connected with the conductive wire.

7. The electronic package of claim 6, wherein the adjustment structure includes an extension portion connected with the conductive wire, and the functional portion and the extension portion branch at one end of the conductive wire.

8. The electronic package of claim 7, wherein the adjustment structure has two paths, one of which is the functional portion used as a short end stub, and another of which is the extension portion used as an open end stub.

9. The electronic package of claim 1, further comprising a grounding structure bonded to the carrier structure.

10. The electronic package of claim 9, wherein the grounding structure includes a plurality of grounding layers and a plurality of conductive blind vias connected with the grounding layers.

11. The electronic package of claim 9, wherein the adjustment structure is electrically connected with the grounding structure.

\* \* \* \* \*